(12) United States Patent
Hoffmann et al.

(10) Patent No.: US 6,956,001 B2
(45) Date of Patent: Oct. 18, 2005

(54) DIELECTRIC CERAMIC MATERIAL

(75) Inventors: Christian Hoffmann, Deutschlandsberg (AT); Helmut Sommariva, Graz (AT); Danilo Suvorov, Ljubljana (SI); Matjaz Valant, Ljubljana (SI)

(73) Assignee: Epcos AG, Munich (DE)

(*) Notice: Subject to any disclaimer, the term of this patent is extended or adjusted under 35 U.S.C. 154(b) by 168 days.

(21) Appl. No.: 10/363,085

(22) PCT Filed: Aug. 13, 2001

(86) PCT No.: PCT/DE01/03100
§ 371 (c)(1),
(2), (4) Date: Aug. 4, 2003

(87) PCT Pub. No.: WO02/18294
PCT Pub. Date: Mar. 7, 2002

(65) Prior Publication Data
US 2004/0048732 A1 Mar. 11, 2004

(30) Foreign Application Priority Data
Aug. 29, 2000 (DE) ........................ 100 42 350

(51) Int. Cl.$^7$ ............................ C04B 35/495
(52) U.S. Cl. .................... 501/134; 252/62.9 R
(58) Field of Search ...................... 501/134; 252/62.9 R

(56) References Cited

U.S. PATENT DOCUMENTS 2,864,713 A * 12/1958 Lewis .................... 501/134

FOREIGN PATENT DOCUMENTS

| EP | 0 916 632 A2 | 5/1999 |
| JP | 62183608 A | 8/1987 |
| JP | 02239150 A | 9/1990 |
| JP | 01234358 A | 9/1998 |
| WO | WO 98/03446 | 1/1998 |

OTHER PUBLICATIONS

CAPLus AN 2000:172317 Petzelt et al, "Infared and microwave dielectric . . . " Mar. 16, 2000.*
Valant et al, "Ag(Nb,Ta)O3–based ceramics with suppressed temperature dependence of permittivity" Journal of the European Ceramic Society, 21 (15) (2001) (no month provided).*

M. Valant, D. Suvorov, "New High–Permittivity Ag(Nb1–xTax)O3 Microwave Ceramics: Part 1, Crystal Structures and Phase–Decomposition Relations"; Journal of the American Ceramic Society, 82 [1], pp. 81–87 (1999), no month provided.

M. Valant, D. Suvorov, "New High–Permittivity Ag(Nb1–xTax)O3 Microwave Ceramics: Part 2, Dielectric Characteristics"; Journal of the American Ceramic Society, 82 [1], pp. 88–93 (1999), no month provided.

A. Kania, "Ag(Nbl–xTax)O3 Solid Solutions–Dielectric Properties and Phase Transitions" Phase Transitions, (1983), no month provided vol., 3 pp. 131 bis 140.

Wolfram, E. Gobel: "Existence Range, Structural and Dielectric Properties of . . . ", Mater Res. Bull., 16 (11)(1981), no month provided pp. 1455–1463.

Wakino, K. et al. "Dielectric Resonator Materials and Their Applications for Mobile Communication Systems", Br. Ceram. Trans. J., 89(2), (1990), no month provided pp. 39–43.

Wakino, K. et al. "Microwave Characteristics . . . ", J. Am. Ceram. Soc. 67, (1984), no month provided pp.278–281.

Tamura, H. et al. "Improved High–Q Dielectric Resonator with Complex Perovskite Structure", J. Am. Ceram. Soc. 67, 1984, no month provided.

* cited by examiner

Primary Examiner—David Brunsman
(74) Attorney, Agent, or Firm—Fish & Richardson P.C.

(57) ABSTRACT

A ceramic material includes at least two different components. Each of the components is present in separate phases. Each of the components has a perovskite structure which contains silver in A positions and niobium or tantalum in B positions. A composition of a first component and a composition of a second component has respective permittivities $TK\epsilon_A$ and $TK\epsilon_B$. In the ceramic material, temperature components of the permittivities $TK\epsilon_A$ and $TK\epsilon_B$ have different signs within a temperature interval.

14 Claims, 11 Drawing Sheets

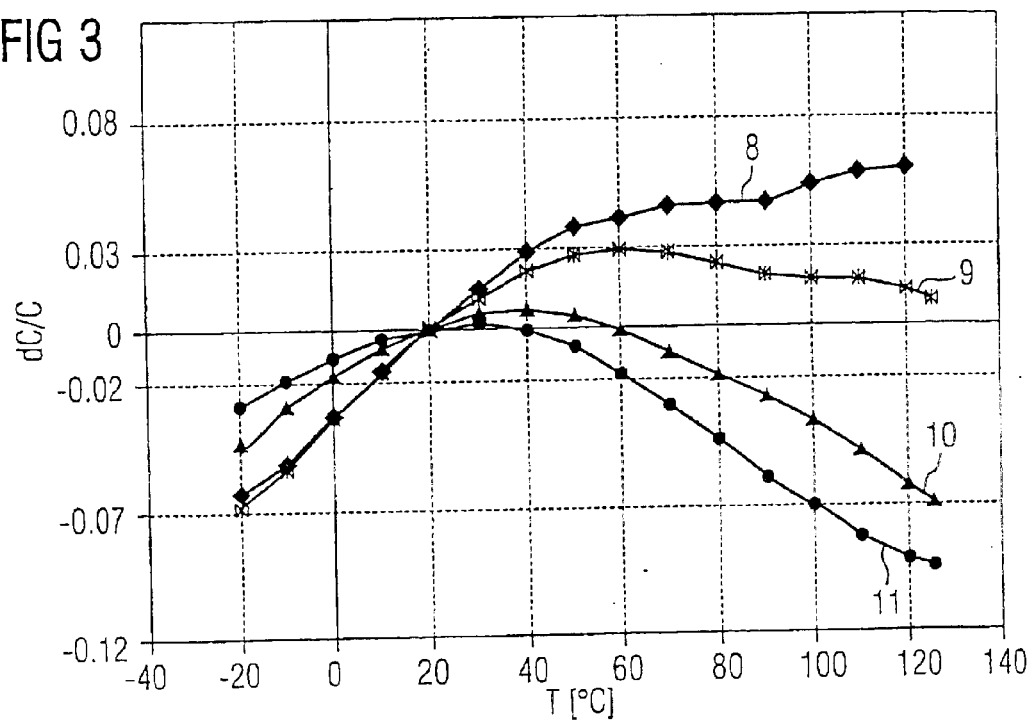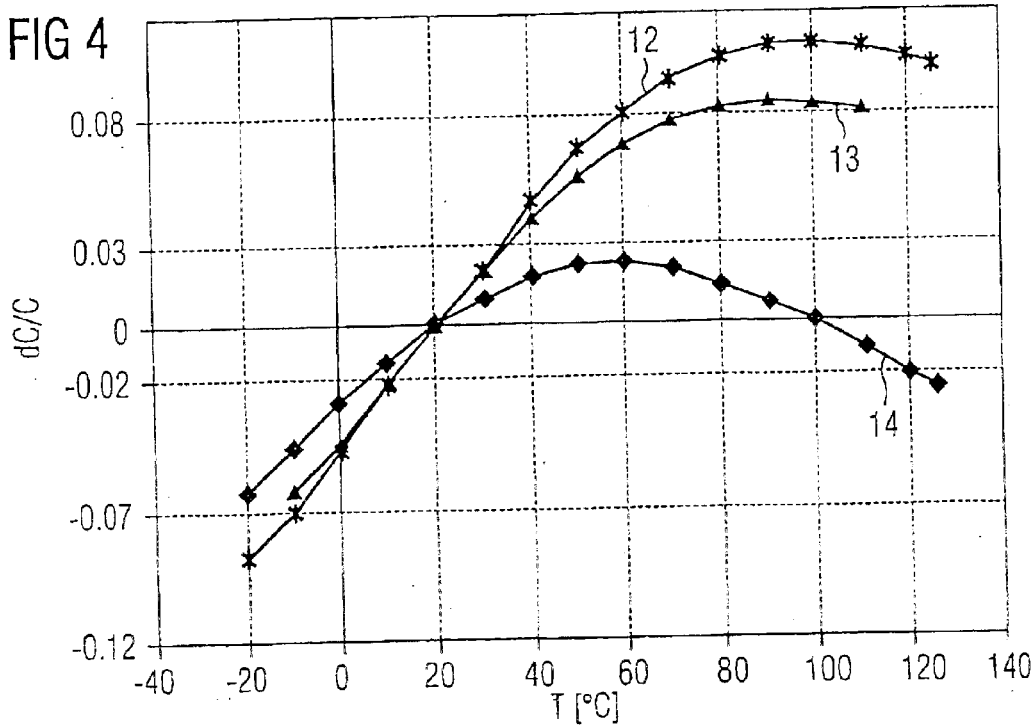

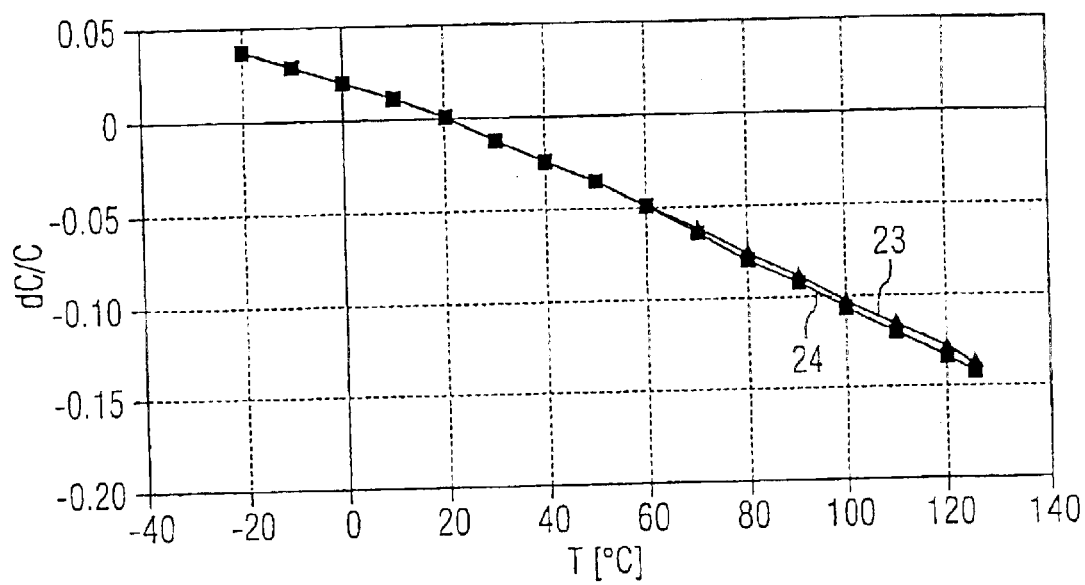
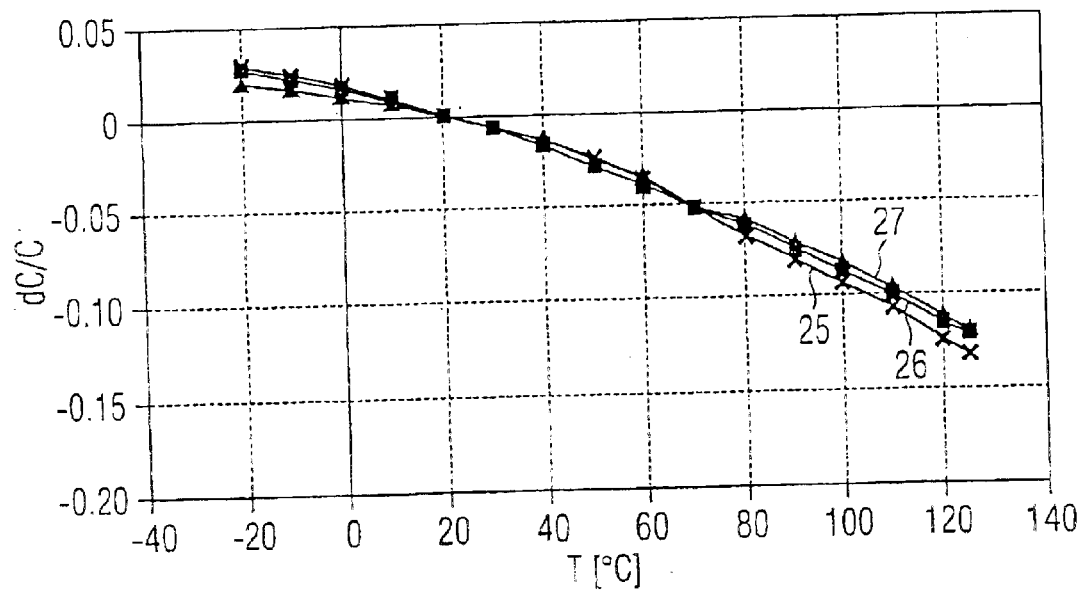

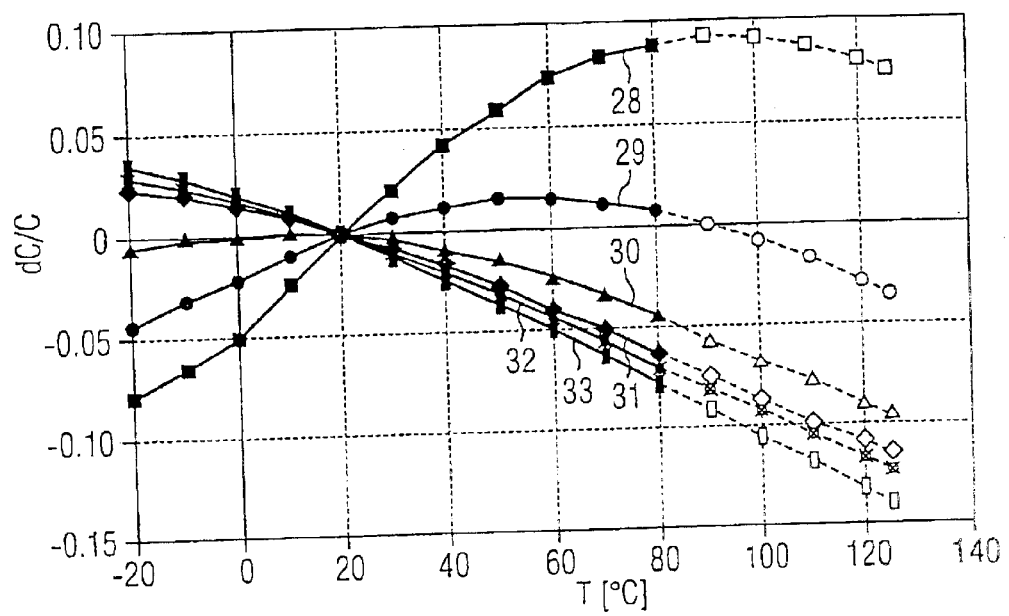
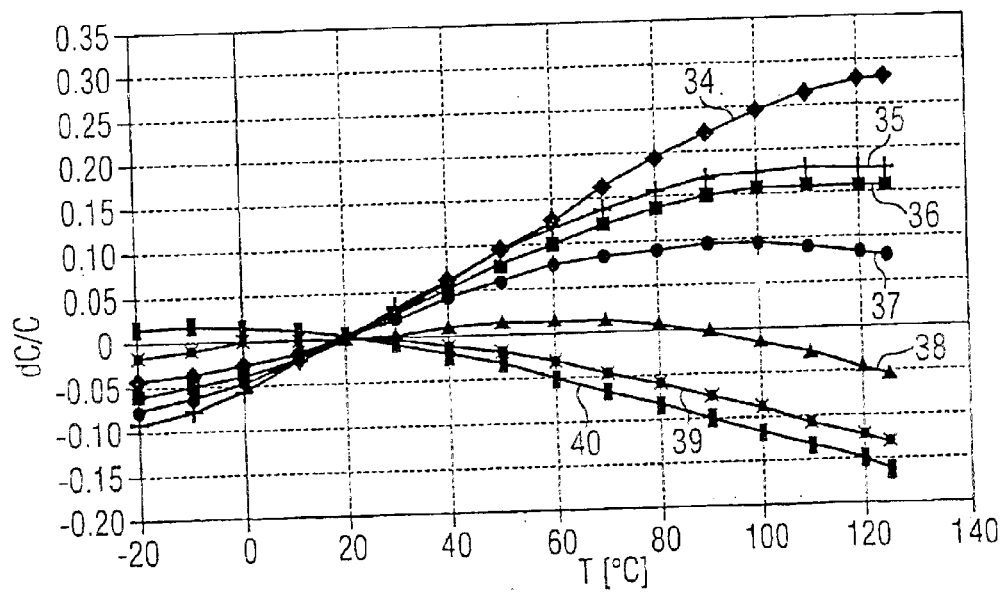

DIELECTRIC CERAMIC MATERIAL

CROSS-REFERENCE TO RELATED APPLICATIONS

This application claims priority to PCT Application No. PCT/DE01/03100, filed on Aug. 13, 2001, and to German Patent Application No. 100 42 350.7, filed on Aug. 29, 2000.

FIELD OF THE INVENTION

The invention relates to a ceramic material that has a perovskite structure and that contains silver in A positions and niobium and tantalum in B positions.

BACKGROUND

Nowadays, ceramic materials are widely used in the electronics industry as dielectric resonators, microwave filters, substrates for microelectronic switching circuits, and so on. These components are used in systems for wireless telecommunications, satellite antennas, radar systems, as well as microwave ovens.

The most important properties of the ceramic materials are their relative permittivity $\epsilon$, the temperature coefficient of their resonant frequency TKf and their quality factor Qxf, which is a measure of the dielectric losses in the material. These properties are of particular importance for use in microwave components. The higher the quality factor, the lower the dielectric losses and the more selectively a microwave component can be tailored to a specific frequency with the aid of the ceramics.

During the course of the continuing miniaturization of ceramic components, especially in frequency ranges up to between 1 and 2 GHz, it is becoming increasingly important to use ceramic materials with high relative permittivity. Such materials permit the production of ceramic components with very small dimensions, such as those that can be used advantageously in wireless telecommunications systems.

A ceramic material is known from printed publication JP 01234358 which is produced on the basis of titanium oxide, barium oxide and neodymium oxide. This ceramic material contains an additive of samarium oxide. The amount of samarium oxide added is used to adjust the temperature response of the resonant frequency of the ceramic material. A ceramic composition for microwave applications is known from printed publication JP 02239150 A, which is produced on the basis of barium oxide, titanium oxide, samarium oxide, cerium oxide and neodymium oxide.

The disadvantage of the ceramic materials specified in the foregoing Japanese documents is that they exhibit a relatively low relative permittivity $\epsilon$ value of between 85 and 90. As a result, highly miniaturized microwave components cannot be produced with these ceramic materials.

A ceramic material is known from the printed publication by A. Kania, "$Ag(Nb_{1-x}Ta_x)O_3$ Solid Solutions—Dielectric Properties and Phase Transitions," Phase Transitions, 1983, Volume 3, pp. 131 to 140, which is produced on the basis of silver, niobium and tantalum, hereinafter referred to as ANT, and is present in the form of a "solid solution" of the two materials $AgNbO_3$ and $AgTaO_3$. The ceramic material described in this publication exhibits the composition $Ag(Nb_{1-x}Ta_x)O_3$, hereinafter referred to as ANTx, wherein x can vary between 0 and 0.7. Depending on the composition, the ceramic material exhibits an $\epsilon$ of between 80 and 400 at a temperature of approximately 300 K.

It is known, from the printed publication by Matjaz Valant and Danilo Suvorov, "New High-Permittivity $Ag(Nb_{1-x}Ta_x)O_3$ Microwave Ceramics: Part 2, Dielectric Characteristics," J. Am. Ceram. Soc. 82[1], pp. 88–93 (1999), that disc-shaped ceramic objects comprised of ANT with an x-parameter of between 0.46 and 0.54 exhibit a high relative change in relative permittivity $\epsilon$ in the temperature interval between −20° C. and 120° C. In particular, it was demonstrated at the same time that the progression of the relative change in $\epsilon$ with the temperature follows a curve that exhibits a maximum between 20° C. and 70° C., and assumes values of between −0.07 and 0.01.

It is also known, from printed publication WO 98/03446, that the temperature coefficient of relative permittivity TK$\epsilon$ at individual temperatures can be reduced to very small values down to ±70 ppm/K as a result of doping ANT with lithium, wolfram, manganese or bismuth.

Although the known ANT materials exhibit a high $\epsilon$, they are disadvantageous in that the values of TK$\epsilon$ are relatively high in the temperature range that is of interest for applications, i.e., between −20° C. and 80° C.

SUMMARY

The objective of the present invention, therefore, is to provide a ceramic material that exhibits a high relative permittivity $\epsilon$ as well as a low temperature coefficient TK$\epsilon$ with low dielectric losses.

According to the invention, this objective is obtained with a ceramic material according to claim 1. Further embodiments of the invention may be derived from the ensuing claims.

The invention specifies a ceramic material that contains at least two different components, each of which is present in phases separate from one another. Each of these components exhibits a perovskite structure, which contains silver in the A positions and niobium and tantalum in the B positions. The composition of one of the components (component A) and the composition of another of the components (component B), respectively, is selected in such a way that the temperature coefficients of their relative permittivities TK$\epsilon_A$ and TK$\epsilon_B$ exhibit different signs within a temperature interval.

One advantage of the ANT material is that it exhibits a high $\epsilon$>300. A further advantage of the ceramic material of the invention is that it exhibits low dielectric losses. As a result of the mixture of two components, each of which exhibits a TK$\epsilon$ with a different sign, it can be achieved that the temperature dependencies of the relative permittivities essentially compensate one another, so that the ceramic material of the invention exhibits a smaller TK$\epsilon$ than its components. This compensation cannot only occur intermittently at fixed temperatures, but also across the entire temperature interval within which the individual components exhibit different signs. Thus, the compensation is not limited to individual points on the temperature scale.

Because the components in the ceramic material of the invention are present as separate phases, the TK$\epsilon$ of the ceramic material, in the event that it includes only two different components, can be specified by the Lichtenecker rule formulated below:

$$TK\epsilon = V \times TK\epsilon_A + (1-V) \times TK\epsilon_B.$$

In this formula, V represents the volume share of component A in the total volume of the components, while TK$\epsilon_A$ and TK$\epsilon_B$ represent the temperature coefficients of components A and B, respectively.

It follows from the Lichtenecker rule that complete compensation of the temperature coefficients of the relative permittivities can occur as a result of suitable selection of the volume share of component A for a specific temperature. This Lichtenecker rule is now used to determine an optimal volume share of component A in the total volume of components A and B, so that optimal compensation of the temperature coefficients can be achieved in the temperature interval within which the individual components exhibit different signs.

To this end, according to the invention, the volume share of component A in the total volume of components A and B is selected in such a way that it deviates by less than 25% from a volume share V calculated with the following formula:

$$V \times S_A + (1-V) \times S_B = 0.$$

In this formula, $S_A$ and $S_B$, respectively, represent the slope of the straight lines that best approximate the respective temperature-dependent progression of the relative change in the relative permittivities of component A and/or component B in the temperature interval.

As a result of the assignment, in accordance with the invention, of the Lichtenecker rule valid for individual temperatures to a temperature interval, it is possible to achieve optimal compensation of temperature coefficients TKϵ with different signs. With the help of the arithmetic rule specified above, the mean of the temperature coefficients TKϵ, weighted with the volume share, is used to calculate suitable volume shares.

Because the Lichtenecker rule on which the calculation is based adds the TKϵ values linearly, the compensation of the temperature coefficients TKϵ functions better the more effectively the temperature-dependent progression of the relative change in the relative permittivities of the individual components can be approximated to a linear progression. Consequently, it is desirable to approximate such a linear progression to the greatest possible extent by using a suitable composition of the components.

Such an approximation to linear behavior can take place in an especially advantageous manner by selecting a suitable quantitative ratio of niobium to tantalum for one of the components.

Another approach to influencing the temperature-dependent progression of TKϵ in a favorable manner includes adding one or more doping substances to one component at a concentration of no more than 20% for each substance.

In the following, the invention is explained in greater detail on the basis of exemplary embodiments and the corresponding figures.

Various ANT ceramic materials are described that can be used as component A or component B of the ceramic material of the invention. In addition, ceramic materials of the invention are described which are produced by mixing a component A with a component B, both in the form of a calcined powder, and by subsequently sintering the mixture. Slice samples of each of the ceramic materials described above are produced and provided with an upper and a lower electrode, thereby producing a capacitor. Both the progression of the relative change in capacitance as a factor of the temperature, hereinafter referred to simply as the progression, and the electrical parameters indicated in the tables were measured in these slice samples,

BRIEF DESCRIPTION OF THE DRAWINGS

Each of the remaining FIGS. 2 to 19 depicts the progression of various ANT materials that can be used as component A or component B in the ceramic material of the invention.

In addition, FIGS. 11, 14, 15, 16, 17, 18 and 19 depict the progression of mixtures of a component A with a component B.

DETAILED DESCRIPTION

The relative change in the capacitance ΔC/C of the slice sample as a factor of the temperature is indicated in each of the figures. The change in capacitance is directly linked to the value Δϵ/ϵ through C=ϵ×A/d.

The following examples depict samples in which vanadium oxide ($V_2O_5$) was used as a sintering process material. As a result, the sintering temperature could be reduced from 1140° C. to a temperature between 1050° C. and 1080° C., which is desirable for various applications of ANT. The addition of $V_2O_5$ does not change the composition of the ANT phase, since the vanadium oxide becomes enriched, at grain boundaries, to an independent vanadium-rich phase, as microstructure analyses have demonstrated.

Figure 1:
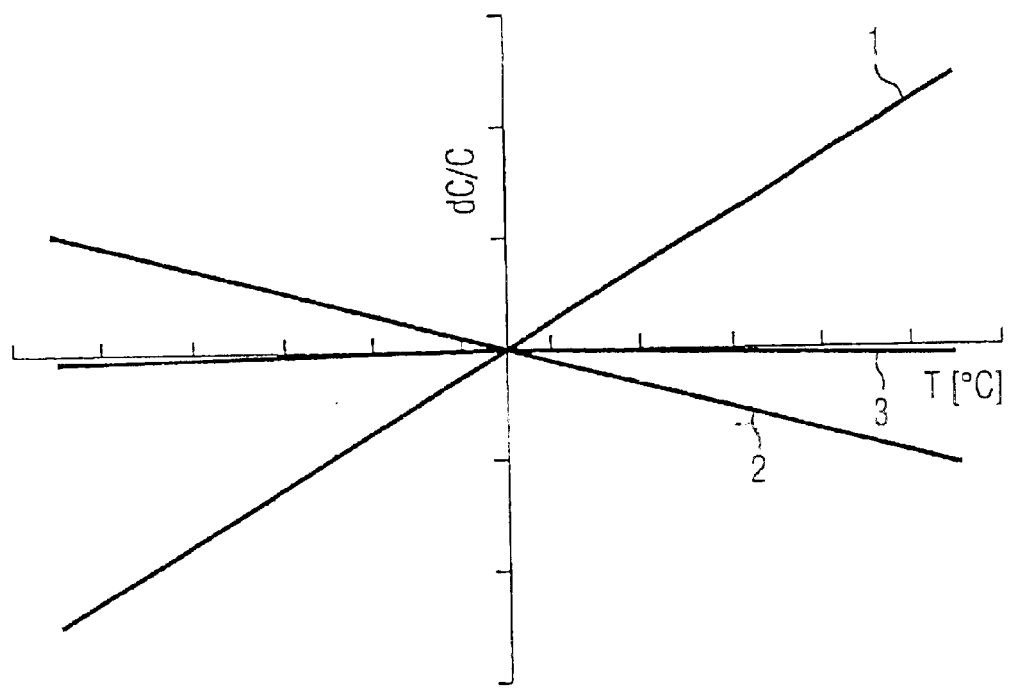
FIG. 1 depicts, in a schematic view, the inventive principle of compensation of a component A with a positive TKϵ$_A$ and a component B with a negative TKϵ$_B$.

FIG. 1 depicts the temperature dependency of the relative change in capacitance ΔC/C, in which curve 3 corresponds to the progression of a ceramic material of the invention that is mixed by mixing a component A (curve 1) with a component B (curve 2). Because components A and B are present in separate phases, the temperature coefficient of the mixture of the components can be portrayed at any temperature using simple addition, weighted by the volume shares, of the temperature coefficients of the individual components. In the example depicted in FIG. 1, the volume share of component B in the total volume of components A and B is 70%. A considerable reduction in the temperature coefficient can be achieved through suitable selection of the volume share. In FIG. 1, it is evident that the curve 3 barely deviates from the abscissa. It should be noted that FIG. 1 is simply an idealized depiction, since components with temperature coefficients that progress in a purely linear fashion cannot be realized.

Figure 2A:
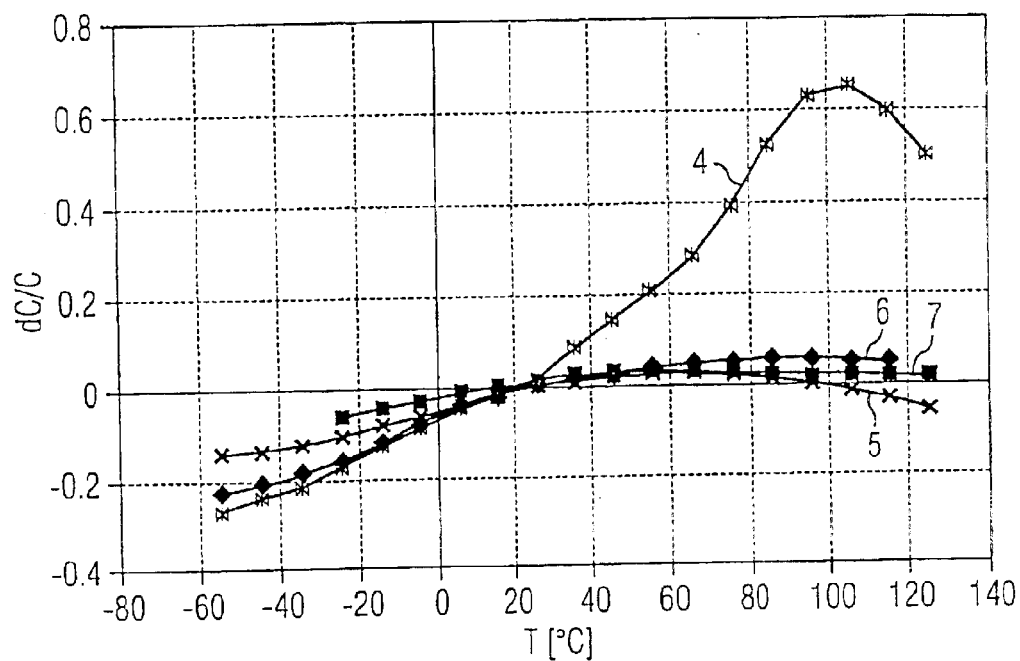
Figure 2B:
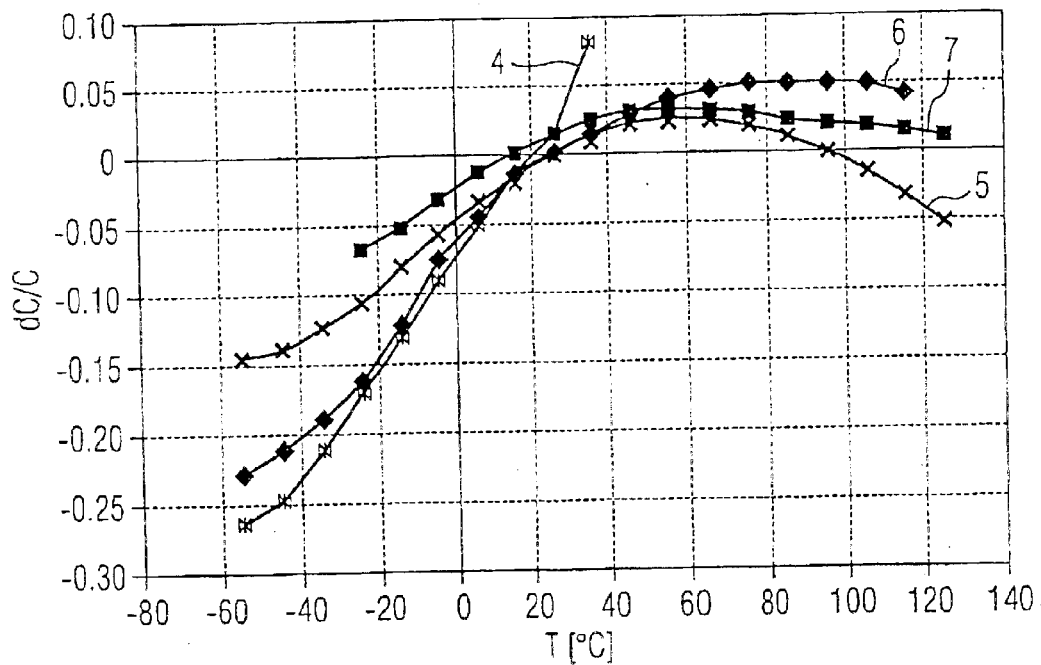

The following examples according to FIG. 2 portray samples with the composition $(Ag_{1-y}M'_y)(Nb_{1-x}Ta_x)O_3$, where y=0.1 and x=0.5. FIG. 2A depicts the progression of ΔC/C, where M' is lithium in curve 4, sodium in curve 6, and potassium in curve 7. Curve 5 depicts a non-doped ANT sample with the composition mentioned above, where y=0. FIG. 2B depicts the curves from FIG. 2A with an enlarged linear measure of the ordinates.

The following Table 1 depicts the dielectric properties of the ANT samples from FIG. 2, provided with a metal M'.

TABLE 1

Dielectric properties and sintering temperatures for ANT samples in accordance with FIG. 2.

| | | ANT y = 0 | $M^1$ = Li | $M^1$ = Na | $M^1$ = K |
|---|---|---|---|---|---|
| RF (1 MHz) | ϵ | 356 | 516 | 374 | 399 |
| | tanδ (×10$^{-3}$) | 2 | 10.2 | 1.8 | 1.5 |
| MW (2 GHz) | ϵ' | 376 | — | 366 | 402 |
| | Qxf (GHz) | 623 | — | 701 | 390 |
| $T_{sinter}$ (° C.) | | 1050 | 1050 | 1050 | 1080 |

The properties of non-doped ANT sample are indicated in the first column of Table 1. The data for an ANT sample doped with lithium (curve 4), sodium (curve 6) and potassium (curve 7), respectively, are indicated in the second, third and fourth columns. The values, measured at a radio frequency, for $\epsilon$ and for the loss angle tan δ, are indicated in the first two lines of Table 1. The values for relative permittivity $\epsilon'$ and for the quality factor Qxf (in GHz units), measured at 2 GHz, are indicated in the third and fourth lines. The sintering temperature at which the respective samples were produced is indicated in the fifth line of Table 1.

The samples indicated are all characterized by high relative permittivities.

As a result of doping with sodium (see curve 6), the temperature progression maximum becomes broader while, at the same time, dependency becomes stronger at lower temperatures. Doping with the help of potassium flattens the temperature progression, thereby reducing the temperature dependency within the entire range studied, i.e., between −80° C. and 120° C.

In a further series of experiments, the ratio of niobium to tantalum was varied, in addition to doping in the A positions.

FIG. 3 depicts the temperature progression for a component A with the composition $(Ag_{1-y}M^I_y)(Nb_{1-x}Ta_x)O_3$, where $M^I$=potassium and y=0.1, wherein x=0.46 for curve 8, x=0.48 for curve 9, x=0.52 for curve 10 and x=0.54 for curve 11.

FIG. 4 depicts the temperature progression for a component A with the composition $(Ag_{1-y}M^I_y)(Nb_{1-x}Ta_x)O_3$, where y=0.1 and $M^I$=sodium, wherein x=0.46 for curve 12, x=0.5 for curve 13 and x=0.54 for curve 14.

As is evident in FIGS. 3 and 4, variation of the niobium/tantalum ratio influences the slope of the curves in the range of higher temperatures. As the niobium concentration increases, the slope of the curves changes from a heavily falling to a slightly rising progression. As is evident in FIG. 4, variation of the niobium/tantalum ratio with sodium-doped ANT samples influences the position of the maximum of the curve, which can be shifted from 100° C. to 50° C. Other dielectric properties were hardly changed by changing the niobium/tantalum ratio, so that their values deviate from those indicated in Table 1 by less than 10%.

Another doping option includes using a metal $M^{III}$ in the A positions of the perovskite structure and a metal $M^{IV}$ in the B positions of the perovskite structure as doping substances, in accordance with the formula $(Ag_{1-y}M^{III}_y)(Nb_{1-x}Ta_x)_{1-y}M^{IV}_y)O_3$. To avoid modifying the electrical properties of the crystal lattice in this process, a doping substance with a vacancy elevated by +1 in comparison to that of the host metal must be combined with a second doping substance with a vacancy lowered by −1 in comparison that of the host metal. The ionic radii of the doping substances used are not critical within a certain range, because the two doping substances can be both larger and smaller than the respective host ion.

In the following examples (FIGS. 5, 6, 7, 8), the respective doping substances indicated in Table 2 were used in the A positions or in the B positions, wherein, in each case, 5% of the silver and/or niobium/tantalum was replaced with the doping substance and, at the same time, x=0.5.

The individual examples of various dopings of ANT, together with the values for $\epsilon$ and tan δ measured with these samples, as well as for shrinkage S (in %) of the ceramic material following five hours of tempering at a temperature of 1050° C., are indicated in Table 2 below. The relative permittivities for all doubly doped samples exhibit very high values ranging from 275 to 433. Samples doped with barium and zirconium exhibit an $\epsilon$ of 590. Due to high dielectric losses, however, they are not suitable for use as microwave components. The dielectric losses for the other samples were measured at 1 MHz, resulting in values not greater than $1.6 \times 10^{-3}$. Consequently, the other samples are very well suited for microwave applications. It should also be noted in this context that the element samarium can be replaced with other rare earth elements, such as lanthanum, cerium, praseodymium, neodymium, europium, gadolinium, terbium, dysprosium, holmium, erbium, thulium, ytterbium and lutetium.

TABLE 2

Relative permittivity, dielectric losses and shrinkage of doubly doped ANT samples following sintering at 1050° C. for a duration of five hours

| No. | A position | B position | $\epsilon$ | tanδ | S (%) |
|---|---|---|---|---|---|
| 1 | Sm | In | 304.28 | 0.0008 | 7.2 |
| 2 | Sm | Sc | 275.46 | 0.0016 | 8.1 |
| 3 | Sm | Ga | 306.43 | 0.0014 | 7.9 |
| 4 | Bi | In | 418.60 | 0.0011 | 10.4 |
| 5 | Bi | Sc | 401.26 | 0.0012 | 10.6 |
| 6 | Bi | Ga | 426.21 | 0.0013 | 10.4 |
| 7 | Ba | Sn | 382.54 | 0.0014 | 8.3 |
| 8 | Ca | Sn | 307.13 | 0.0009 | 6.5 |
| 9 | Pb | Sn | 433.56 | 0.0012 | 8.8 |
| 10 | Sr | Sn | 297.43 | 0.0009 | 5.9 |
| 11 | Ba | Zr | 589.62 | 0.0022 | 11.4 |
| 12 | Ca | Zr | 332.04 | 0.0016 | 10.0 |
| 13 | Pb | Zr | 385.12 | 0.0013 | 8.5 |
| 14 | Sr | Zr | 316.16 | 0.0005 | 7.2 |

Figure 5:
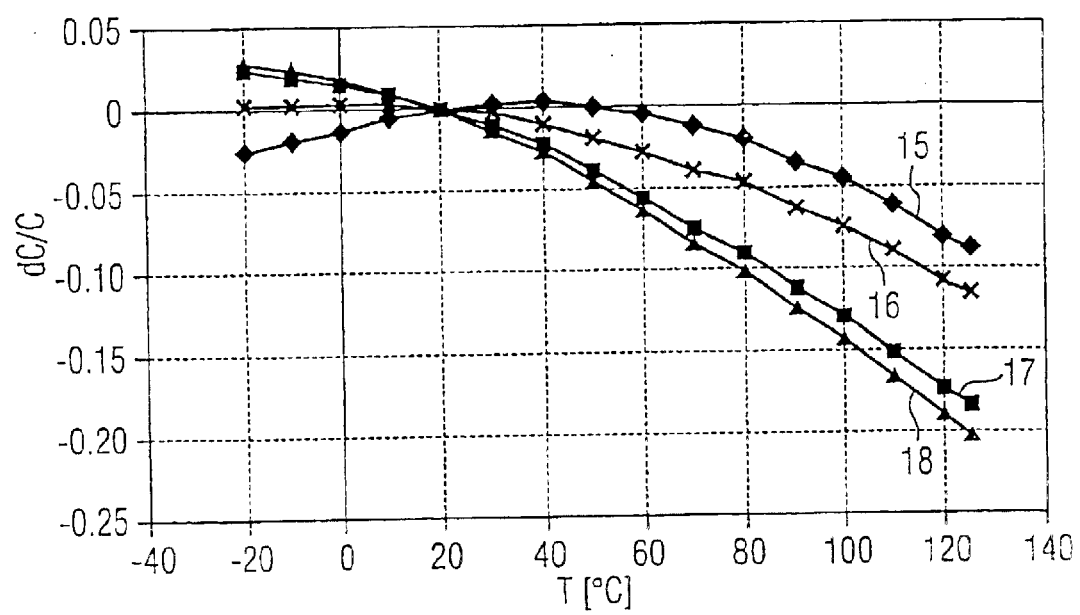

FIG. 5 depicts the progression for samples doped with tin in the B position. In this process, 5 mol % of the ANT starting material was replaced with a doping substance (y=0.05) in both the A position and the B position. Curve 15 depicts the progression for barium, curve 16 for strontium, curve 17 for calcium and curve 18 for lead as the doping substance in the A position of the perovskite structure.

Figure 6:
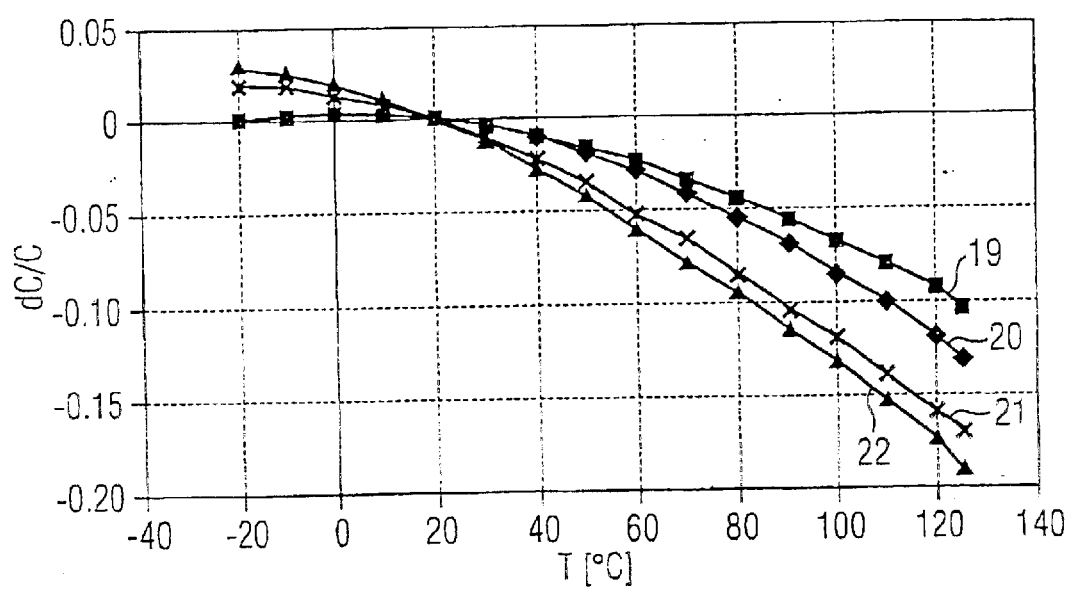

FIG. 6 depicts the respective progressions for samples (y=0.05) in which zirconium was used as the doping substance in the B position. In the figure, curve 19 depicts the progression for calcium, curve 20 the progression for barium, curve 21 the progression for strontium and curve 22 the progression for lead as the doping substance in the B position of the perovskite structure.

FIGS. 5 and 6 show that the progression is non-linear and that it varies depending on the doping substance used. All samples exhibit a negative temperature coefficient of relative permittivity for temperatures between room temperature (20° C.) and 125° C. The curves exhibit a maximum below room temperature. The position of the maximum depends on the selected composition and/or on the selected doping substance.

FIG. 7 depicts the progression for those ANT samples in which bismuth was used as the doping substance in the A position. Curve 23 depicts the progression for scandium, and curve 24 the progression for gallium or indium as the doping substance for the B position, which cannot be differentiated from one another on the scale used here.

FIG. 8 depicts the progression for ANT samples in which samarium was selected as the doping substance for the A position. Curve 26 depicts the progression for scandium, curve 27 the progression for gallium, and curve 25 the progression for indium as the doping substance for the B positions in the samples.

The samples depicted in FIGS. 7 and 8 exhibit a negative temperature coefficient of relative permittivity within the entire temperature interval studied, i.e., between −20° C. and 125° C. In this case, the relationship is almost linear, with a slope that is essentially independent of the combination of the doping substances in the A and/or B positions.

Due to the linear progression of the temperature dependency, these samples from FIG. 7 and FIG. 8 are especially well suited for embodying the ceramic material of the invention.

In a further series of experiments, the effect of the percentage of the doping substances on the temperature progression of relative permittivity was examined using an example of an ANT doped with bismuth/gallium. These experiments were based on an ANT ceramic material with the following composition:

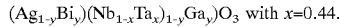
$(Ag_{1-y}Bi_y)(Nb_{1-x}Ta_x)_{1-y}Ga_y)O_3$ with $x=0.44$.

Suitable samples were produced for the values y=0.01, 0.02, 0.03, 0.04 and 0.05. These samples were produced with an (Nb, Ta, Ga)-oxide precursor, which was calcinated together with $V_2O_5$ at 1220° C. for 20 hours.

The precursor was intermittently cooled several times and pressed through a sieve, so as to obtain as homogeneous a mixture as possible at the nuclear level. Silver and bismuth were subsequently added to the pulverized precursor and heated for ten hours at 950° C. The ceramic material was then sintered in an oxygen atmosphere for a period of five hours at 1070° C.

The progression of these samples, measured at 1 MHz, is depicted in FIG. 9. In the figure, curve 28 depicts the progression for y=0, curve 29 the progression for y=0.01, curve 30 the progression for y=0.02, curve 31 the progression for y=0.03, curve 32 the progression for y=0.04 and curve 33 the progression for y=0.05.

In a further series of experiments, measurements were also taken using a combination of samarium/gallium as the doping substance instead of bismuth/gallium. This resulted in the replacement of bismuth with samarium having virtually no impact on the temperature progression. In addition, no significant difference between the bismuth/gallium doping substance combination and the samarium/gallium doping substance combination was observed with respect to the remaining dielectric properties. In all cases, a doping substance concentration of, for example, 5 mol-% caused a slight increase in relative permittivity to a value of ε>420, while the Qxf value, measured at 2 GHz, decreased to <350 GHz.

Due to the nearly linear progression, the ANT samples depicted in FIG. 9, which contain a doping substance concentration of greater than 2 mol-%, are of particular interest for use as component A or component B in the ceramic material of the invention.

In a further series of experiments, the effects of a change in the niobium/tantalum ratio on the temperature progression of ANT samples not containing doping substance were studied.

To this end, seven samples were produced having the composition $Ag(Nb_{1-x}Ta_x)O_3$, wherein the parameter x varies between 0.35 and 0.65. In this case, the same production process was used as was used with the doubly doped samples depicted in FIG. 9.

FIG. 10 depicts the temperature dependency of the relative permittivity of these samples, measured at a frequency of 1 MHz. In the figure, curve 34 describes the composition for x=0.35, curve 35 the composition for x=0.4, curve 36 the composition for x=0.42, curve 37 the composition for x=0.44, curve 38 the composition for x=0.5, curve 39 the composition for x=0.6, and curve 40 the composition for x=0.65.

The results depicted in FIG. 10 demonstrate that by simply modifying the niobium/tantalum ratio, both monotonically rising and monotonically falling behavior of the temperature coefficients can be produced. In this process, the boundary between rising and falling behavior lies at approximately x=0.5.

Due to the nearly linear progression, the ceramic compositions corresponding to curves 34 as well as 39 and 40 in FIG. 10 are very well suited for use as component A or B in the ceramic material of the invention.

In a further series of experiments, the results obtained from previous experiments were applied in producing various ceramic materials as mixtures of a component A and a component B. In this case, the respective components were calcined separately and additionally processed into a powder. Subsequently, the powders of component A and component B were mixed together and then sintered.

To ensure that compensation of opposing temperature progressions functions properly, components A and B must be present in separate phases from one another. Tests have demonstrated that to accomplish this, it is necessary to mix together components A and B in the form of powder that is not excessively fine, i.e., with a particle size of >5 μm. If smaller particle sizes are used, a material exchange takes place between the components as a result of diffusion, forming a "solid solution" that represents a new material with correspondingly new properties. At this point, a simple "linear superposition" of components A and B, as described by the Lichtenecker rule, is no longer possible. As a result of the slow diffusion processes that occur when particles larger than 5 μm are used, only the marginal areas of the particles are mixed together, leaving essentially separate phases of component A and component B.

To produce the phase-heterogeneous ceramic material, a ceramic with the composition $Ag(Nb_{1-x}Ta_x)O_3$ was used for component A and a ceramic with the composition $(Ag_{1-y}Bi_y)(N_{1-x}Ta_x)_{1-y}Ga_y)O_3$, with y=0.05, was used for component B. In each case, a value of 0.4 was chosen as the parameter x.

Figure 11A:
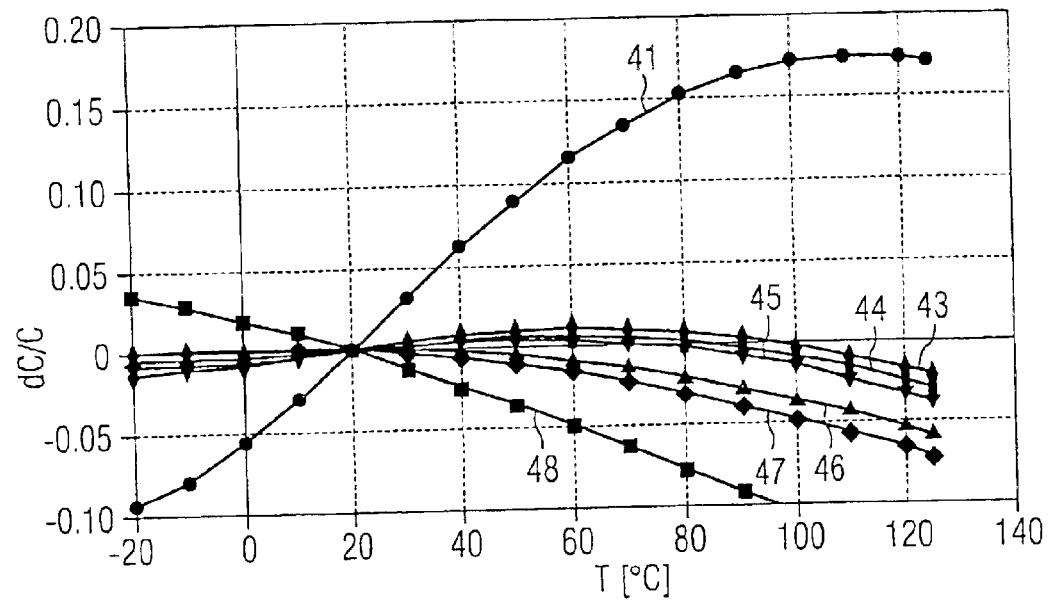
Figure 11B:
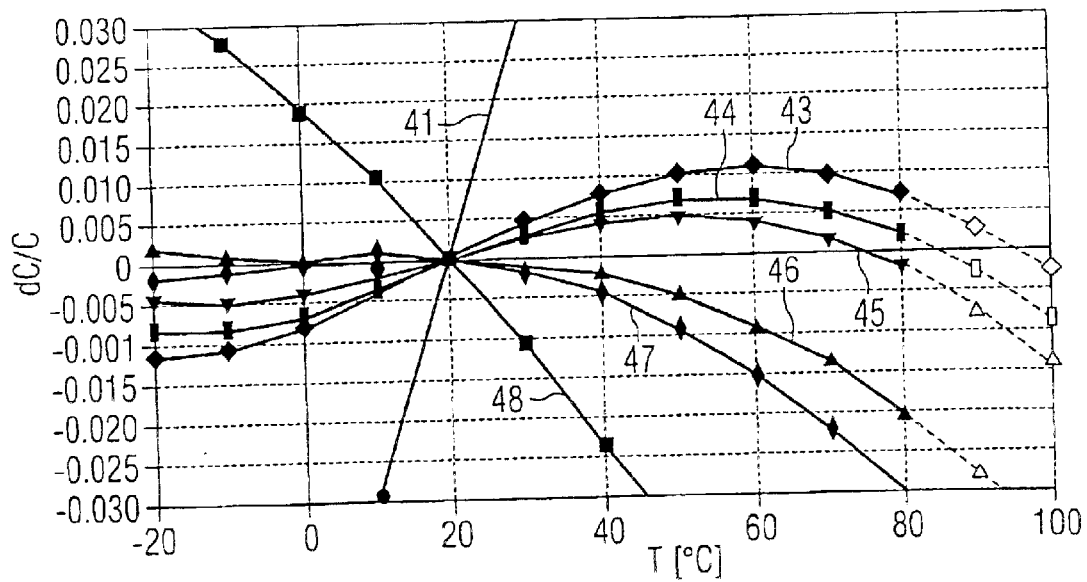

FIG. 11A depicts the progression for these samples, wherein the weight-specific ratio between components A and B is 50/50 in curve 43, 45/55 in curve 44, 42.5/57.5 in curve 45, 35/65 in curve 46, and 40/60 in curve 47. Curve 41 depicts the progression for component A, while curve 48 depicts the progression for component B. FIG. 11B depicts the curves from FIG. 11A using a larger scale for the ordinate.

The curves indicate that the mixture involving a ratio of 42.5/57.5 for component A and component B has the lowest temperature dependency of relative permittivity. Within the temperature interval of −20° C. to 80° C., the relative permittivity varies by less than ±0.5%. In addition, this sample has a high relative permittivity of 420 as well as a sufficiently high Qxf value of 425 GHz.

Additional samples were produced with similar components A and B, which differed from that depicted in FIG. 11 in terms of the choice of a parameter x=0.44.

With these samples, it was found that a mixture ratio of 50/50 (measured in wt. %) exhibited the least temperature dependency. For this sample, where A/B=50/50, a relative permittivity of 428 and a Qxf value of 483 were measured. In the temperature interval between −20° C. and 80° C., the relative permittivity varies by less than ±1%.

In a further series of experiments based on the above-mentioned components A and B, various mixing ratios were tested for an x value of 0.38. The results of these tests showed that the mixing ratio of A/B=32.5/67.5 delivers an optimal value with respect to the compensation of the temperature coefficients of relative permittivity, and that relative permittivity varies by less than ±0.25% in a temperature interval between −20° C. and 80° C. However, this sample exhibits a high concentration in a phase with high dielectric losses, which results in the Qxf value of the sample being reduced to 335.

The dielectric properties of the phase-heterogeneous ceramic materials studied are summarized in Table 3 below. The value for the parameter x is indicated in the first column. The weight-specific mixing ratio of components A and B is indicated in the second column.

Columns 3, 4, 5 and 6 depict the shrinkage S (indicated in %), the relative permittivity $\epsilon$, the maximum relative change in relative permittivity within the temperature interval between −20° C. and 80° C., as well as the Qxf value, measured in GHz.

TABLE 3

Weight ratio between component A and component B, shrinkage and dielectric properties of the samples, with the optimal mixing ratio

| X | A:B | S(%) | $\epsilon$ | $|\Delta\epsilon/\epsilon|_{max}$ | Qxf (GHz) |
|---|---|---|---|---|---|
| 0.44 | 50:50 | 12 | 428 | 1 | 483 |
| 0.40 | 42.5:57.5 | 10 | 420 | 0.5 | 425 |
| 0.38 | 32.5:67.5 | 9 | 396 | 0.25 | 335 |

The direct-current resistivity of the ceramic is an important parameter for use of the ceramic material of the invention as a dielectric in capacitors. Experiments with the ceramic compositions described further above have shown that the direct-current resistivity of no more than a few hundred MΩ of the ceramics provided with doping substances is too low. In contrast, pure ANT with a niobium/tantalum ratio of 50/50 exhibits a high direct-current resistivity of 9×10$^8$ MΩ. In addition to the doping substances, the sintering process material vanadium oxide was also identified as a cause of the reduction in direct-current resistivity.

Thus, the objective of the ensuing tests was to find a sintering process material that only reduces the direct-current resistivity of the ceramic to an insignificant degree. Boric acid ($H_3Bo_3$) is such a sintering process material. Boric acid can be added to the ANT at a weight percentage of 1 to 5%. As it is sintered, the ceramic shrinks by 14%, without showing any signs of decomposition. This indicates that $H_3Bo_3$ is well suited for use as sintering process material. In particular, $H_3Bo_3$ is also suitable for reducing the sintering temperature from 1220° C. to less than 1140° C.

Electrical measures of an ANTx sample, where x=0.42, and to which 1 wt. % of $H_3Bo_3$ has been added, have shown that boric acid as a sintering process material affects neither relative permittivity nor dielectric losses to an impermissible extent. For this sample, an $\epsilon$ of 426 and a tan δ of 0.4×10$^{-3}$ were measured at a frequency of 1 MHz. In addition, the sample exhibits a direct-current resistivity of 2×10$^7$ MΩ under alternating current. This indicates that boric acid as a sintering process material is suitable for the production of a ceramic material of the invention, which is also qualified for use in capacitors.

It was also possible to demonstrate that the use of boric acid as a sintering process material, as compared to $V_2O_5$, positively influences the temperature dependency of relative permittivity.

Figure 12:
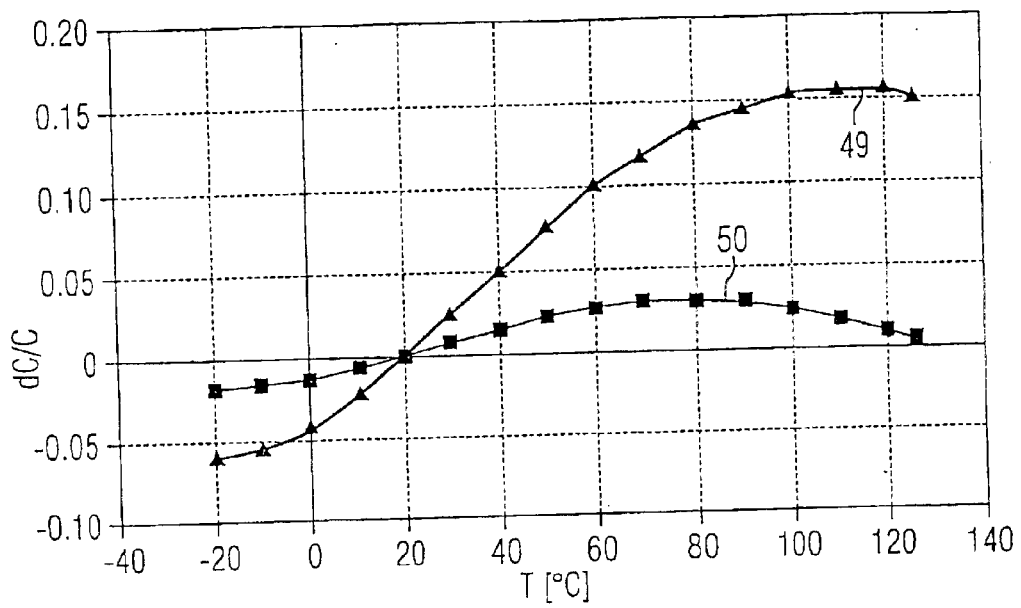

FIG. 12 depicts the temperature progression of an ANTx sample (x=0.42) to which 2 wt. % of $H_3Bo_3$ (curve 50) or 2 wt. % of $V_2O_5$ (curve 49) has been added. FIG. 12 indicates that boric acid, as compared to $V_2O_5$, positively influences the temperature behavior of relative permittivity.

Thus, the ensuing experiments were conducted to determine the extent to which the ceramic material of the invention can be successfully executed without the participation of doping substances, using only ANTx with a varying ratio of niobium to tantalum. The effect of using different weight percentages of added $H_3Bo_3$ as a sintering process material was also examined.

In the samples described below, 1 and 1.5 wt. % of $H_3Bo_3$, respectively, was added to the ceramic material prior to final calcination at 950° C. The ceramic material was then sintered at 1070° C. for a period of five hours. Subsequently, the dielectric properties of the materials produced in this manner were examined at frequencies of 1 MHz and approximately 2 GHz.

The component B (ANTX with x=0.65) known from the compositions already described further above was used as component B in the composite ceramic material of the invention. The components were mixed together as granulates with a mean particle size of 30.9 μm (component A) and 27.7 μm (component B), and were subsequently sintered together.

Figure 13:
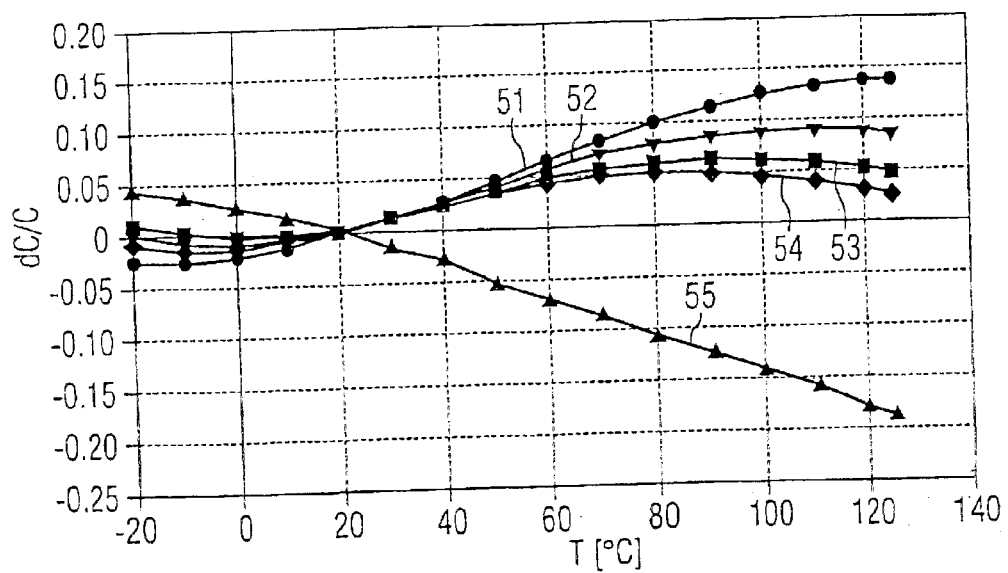

In a first series of experiments, a component B containing 1 wt. % of $H_3Bo_3$ and several possible components A with various excess amounts of niobium relative to tantalum were examined. The results are depicted in FIG. 13. In the figure, each of curves 51 to 54 relates to a component A with a different x content, while curve 55 relates to the above-mentioned component B with x=0.65. Here, curve 51 describes the composition of component B with x=0.35, curve 52 with x=0.38, curve 53 with x=0.40 and curve 54 with x=0.42.

FIG. 13 shows that the composition depicted in curve 51, in particular, exhibits a favorable linearity of progression, which is especially well suited for use as component A in the composite ceramic material of the invention.

Using the various components A depicted in FIG. 13, ceramic materials of the invention with varying mixing ratios of component A to component B were produced in accordance with Table 4 below. The niobium surplus in component A used in each case is indicated as the x value in the first column of Table 4. The weight-specific ratio of component A to component B is indicated in the second column.

Columns 3, 4, 5, 6 and 7 show core values corresponding to Table 2, as well as the shrinkage S of the samples. The respective maximum relative change in relative permittivity in the temperature interval between −20° C. and 80° C. for the respective optimal mixtures, in terms of the progression, of component A and component B is indicated in the last column of Table 4.

TABLE 4

Relative permittivity and dielectric losses for a composite ceramic material containing 1 wt. % of H₃Bo₃ as a sintering process material, sintered at 1070° C. for a period of 5 hours (component B = ANTx with x = 0.65)

|  |  | 1 MHz | | ~2 GHz | | |
|---|---|---|---|---|---|---|
|  | A/B | $\epsilon$ | tan$\delta$ | $\epsilon'$ | Qxf (GHz) | S (%) | $|\Delta\epsilon/\epsilon|_{max}$ (%) |
| .42 | 60/40 | 386 | 0.0007 | 371 | 597 | 10.1 | 1.8 |
|  | 62.5/37.5 | 390 | 0.0002 | 398 | 566 | 9.7 |  |
|  | 70/30 | 408 | 0.0004 | 408 | 492 | 10.9 |  |
| .40 | 40/60 | 328 | 0.0007 | 326 | 664 | 9.3 |  |
|  | 50/50 | 370 | 0.0004 | 385 | 577 | 9.6 |  |
|  | 60/40 | 385 | 0.0004 | 395 | 493 | 9.8 | 1.5 |
| .38 | 35/65 | 339 | 0.0010 | 355 | 654 | 10.2 |  |
|  | 45/55 | 347 | 0.0005 | 357 | 592 | 9.8 |  |
|  | 55/45 | 375 | 0.0005 | 403 | 516 | 10.1 | 1.2 |
| .35 | 30/70 | 317 | 0.0005 | 323 | 644 | 9.0 |  |
|  | 40/60 | 350 | 0.0009 | 363 | 560 | 10.0 |  |
|  | 45/55 | 341 | 0.0002 | 362 | 539 | 9.1 | 0.8 |
|  | 50/50 | 354 | 0.0005 | 375 | 479 | 9.7 |  |

Table 4 shows that at least the composite ceramics produced using the optimal mixing ratio of component A to component B, with varying x values for component A, are suitable for use both in microwave components and multilayer capacitors.

Figure 14:
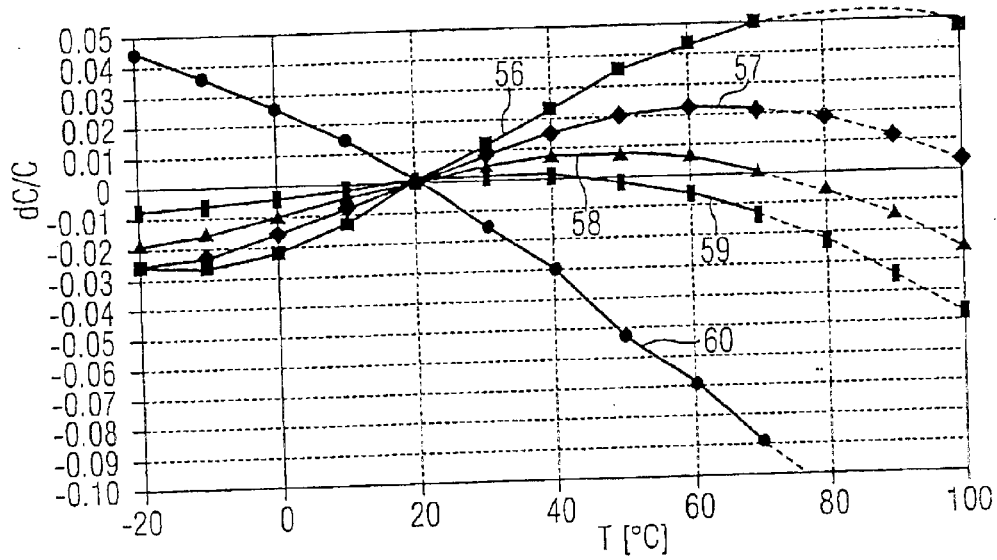

FIG. 14 depicts the progression for various composite ceramics of the invention, with a component A with x=0.42 (8% surplus niobium) and with various mixing ratios of component A to component B. In the figure, curve 56 depicts the progression for a mixing ratio of 60/40, curve 57 the progression for a mixing ratio of 70/30, curve 58 the progression for a mixing ratio of 62.5/37.5, curve 59 the progression for a pure component A and curve 60 the progression for a pure component B.

Figure 15:
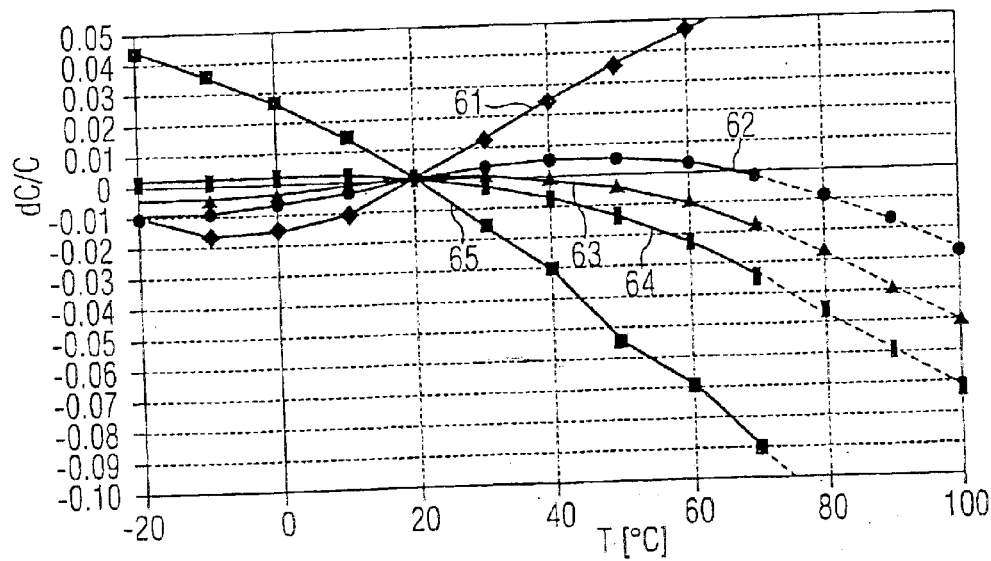

FIG. 15 depicts the progression for various composite ceramics of the invention, with a component A with x=0.40 (10% surplus niobium) and with various mixing ratios of component A to component B. In the figure, curve 62 depicts the progression for a mixing ratio of 60/40, curve 64 the progression for a mixing ratio of 40/60, curve 63 the progression for a mixing ratio of 50/50, curve 61 the progression for a pure component A, and curve 65 the progression for a pure component B.

Figure 16:
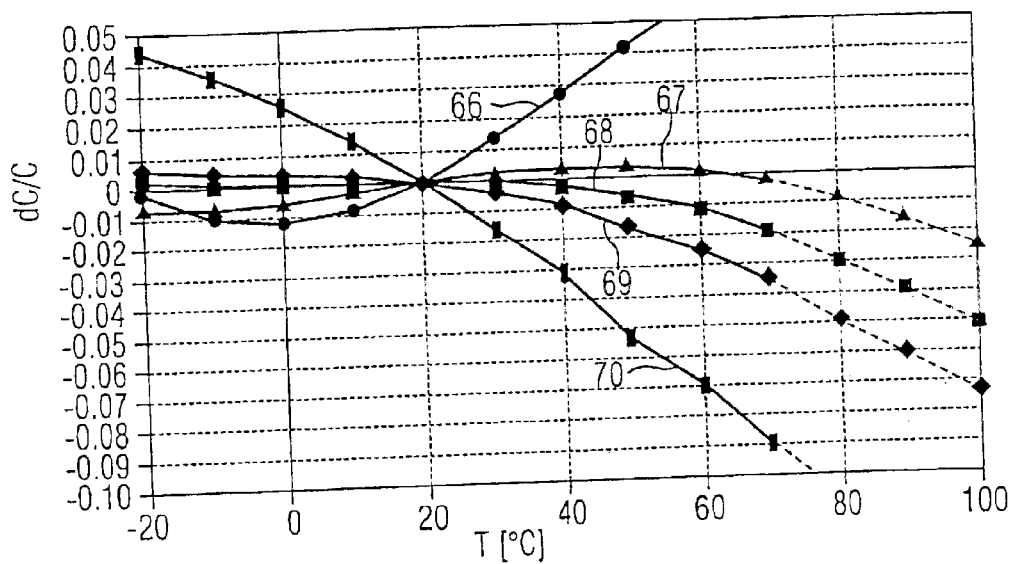

FIG. 16 depicts the progression for various composite ceramics of the invention, with a component A with x=0.38 (12% surplus niobium) and with various mixing ratios of component A to component B. In the figure, curve 69 depicts the progression for a mixing ratio of 35/65, curve 68 the progression for a mixing ratio of 44/55, curve 67 the progression for a mixing ratio of 55/45, curve 70 the progression for a pure component B, and curve 66 the progression for a pure component A.

Figure 17:
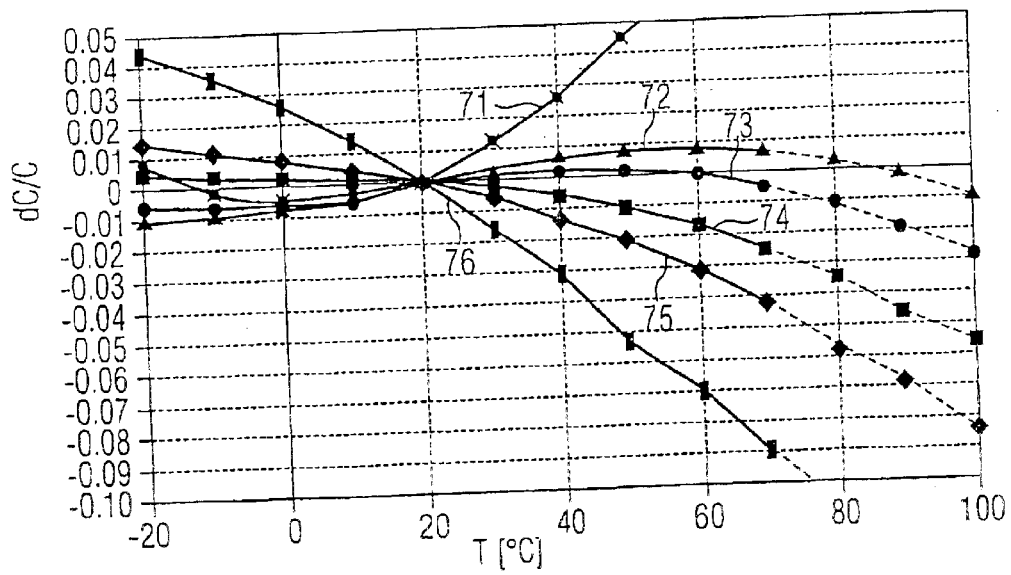

FIG. 17 depicts the progression for various composite ceramics of the invention, with a component A with x=0.35 (15% surplus niobium) and with various mixing ratios of component A to component B. In the figure, curve 75 depicts the progression for a mixing ratio of 30/70, curve 73 the progression for a mixing ratio of 40/60, curve 72 the progression for a mixing ratio of 50/50, curve 71 the progression for a mixing ratio of 45/55, curve 76 the progression for a pure component B and curve 71 the progression for a pure component A.

Additional experiments were conducted to examine the effect of increasing the boric acid concentration from 1 wt. % to 1.5 wt. %. It was found that the elevated boric acid concentration facilitates sintering of the ANT powder. In addition, somewhat higher values are obtained for relative permittivity. The dielectric losses, measured at 1 MHz, exhibit no significant change with the H₃Bo₃ concentration, while the Qxf values at 2 GHz are somewhat less favorable than when 1 wt. % of H₃Bo₃ is added.

Figure 18:
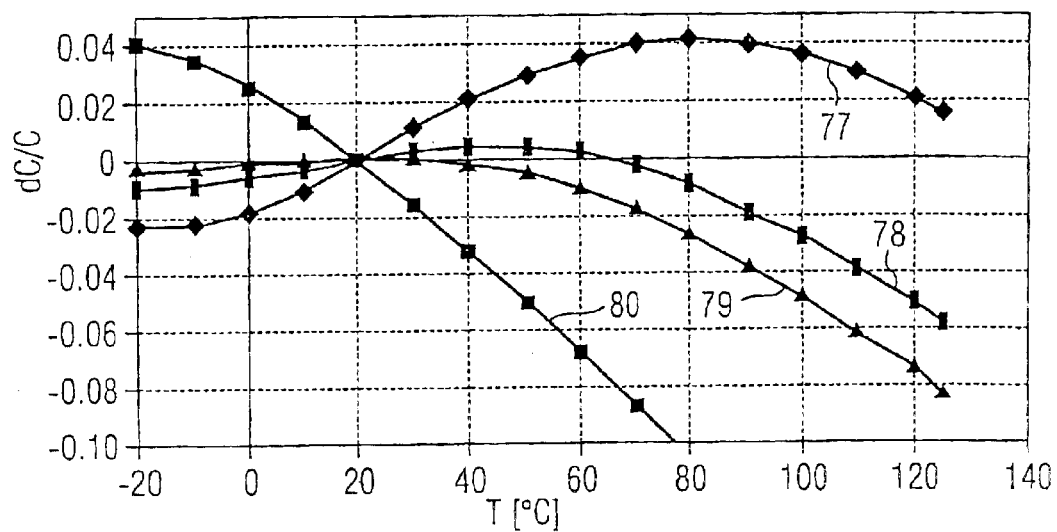

FIG. 18 depicts the progressions for an ANTx system that was produced while adding 1.5 wt. % of H₃Bo₃. The remaining production parameters were identical to those applied with the samples containing 1 wt. % of H₃Bo₃. In the figure, curve 77 depicts the progression for a component A with x=0.42, curve 78 the progression for a mixture of component A and component B with a weight-specific mixing ratio of 70/30, curve 79 a composite ceramic material with a mixing ratio of 60/40 and, finally, curve 80 the progression for component B with x=0.65.

Figure 19:
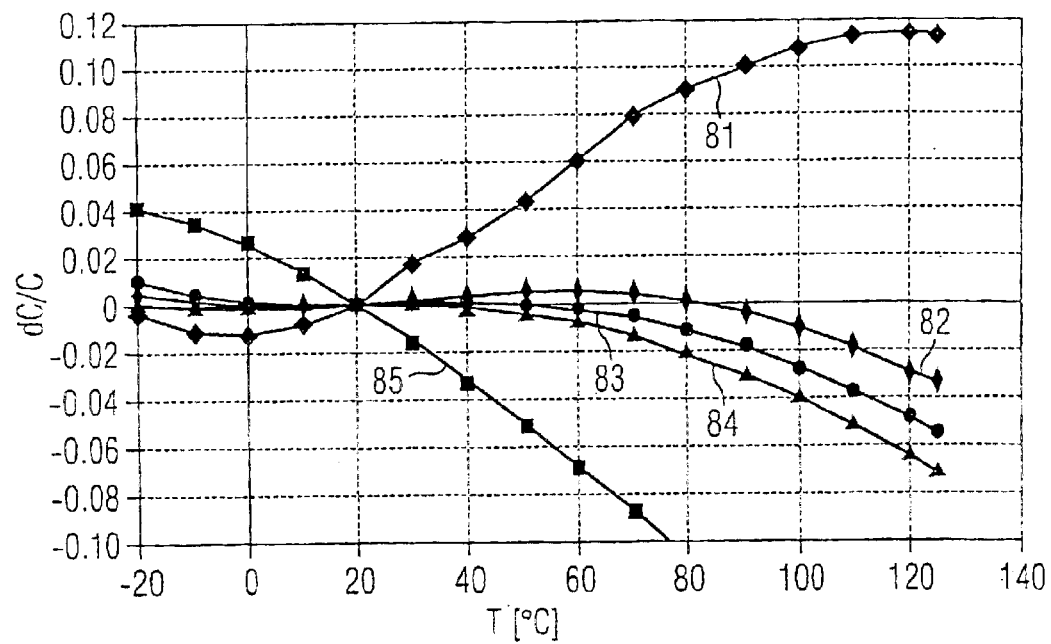

FIG. 19 depicts the temperature progression of a composite ceramic material of the invention (1.5 wt. % of H₃Bo₃), with a component A with x=0.35 (15% surplus niobium), and with various mixing ratios of component A to component B. Curve 81 depicts component A with x=0.35, curve 82 depicts a mixture with a mixing ratio of 60/40, curve 83 with a mixing ratio of 55/45, curve 84 with a mixing ratio of 45/55 and curve 85 component B with x=0.65.

The dielectric properties and shrinkage for mixtures of component B with a niobium surplus of 8% (x=0.42) and with a niobium surplus of 15% (x=0.65) are indicated in Table 5 below, which corresponds to Table 4.

In addition, the maximum relative change in the relative permittivities in the temperature interval between –20° C. and 80° C. is indicated in percent to show the respective optimal mixing ratios of component A to component B.

TABLE 5

Relative permittivity and dielectric losses for a composite ceramic material containing 1 wt. % of H₃Bo₃ as a sintering process material, sintered at 1070° C. for a period of five hours (component B = ANTx with x = 0.65)

|  |  | 1 MHz | | ~2 GHz | | |
|---|---|---|---|---|---|---|
| x | A/B | $\epsilon$ | tan$\delta$ | $\epsilon'$ | Qxf (GHz) | S (%) | $|\Delta\epsilon/\epsilon|_{max}$ (%) |
| 0.42 | 60/40 | 398 | 0.0003 | 395 | 545 | 11.5 |  |
|  | 70/30 | 408 | 0.0004 | 408 | 492 | 10.9 | 1.4 |
| 0.35 | 60/40 | 414 | 0.0004 | 436 | 360 | 11.7 | 0.6 |
|  | 55/45 | 397 | 0.0004 | 435 | 419 | 11.2 |  |
|  | 45/55 | 341 | 0.0002 | 362 | 539 | 10.7 |  |

What is claimed is:

1. A ceramic material comprising:

at least two different components, each of the components being present in separate phases, each of the components having a perovskite structure which contains silver in A positions and niobium or tantalum in B positions, a composition of a first component and a composition of a second component having respective permittivities TK$\epsilon_A$ and TK$\epsilon_B$, wherein temperature components of the permittivities TK$\epsilon_A$ and TK$\epsilon_B$ have different signs within a temperature interval.

2. The ceramic material according to claim 1, wherein a volume share of the first component in a total volume of the first and second components deviates by less than 25% from a volume share V calculated using the following formula:

$$V \times S_A + (1-V) \times S_B = 0,$$

wherein $S_A$ and $S_B$, respectively, represent slopes of straight lines that approximate respective temperature-dependent progression of a relative change in the permittivities of the first and second components in the temperature interval.

3. The ceramic material according to claim 1, wherein at least one of the components is doped with one or more doping substances at a concentration of no more than 20% for each substance.

4. The ceramic material according to claim 1, wherein at least one of the components has a composition of $Ag(Nb_{1-x}Ta_x)O_3$, with $0.30 \leq 1-x \leq 0.70$.

5. The ceramic material according to claim 1, wherein one of the components contains, in the A positions, a metal $M^I$ as a doping substance, wherein $M^I$ is lithium, sodium or potassium and has a composition of $(Ag_{1-y}M^I_y)(Nb_{1-x}Ta_x)O_3$, with $0.45 \leq 1-x \leq 0.55$ and $0 \leq y < 0.15$.

6. The ceramic material according to claim 5, wherein the one of the components contains, in the A positions, as an additional doping substance, a metal $M^{II}$ that differs from $M^I$, wherein $M^{II}$ is selected from among the metals lithium, sodium and potassium, and has a composition $(Ag_{1-y-z}M^I_yM^{II}_z)(Nb_{1-x}Ta_x)O_3$, with $0.45 \leq 1-x \leq 0.55, 0 \leq y \leq 0.15$ and $0 < z \leq 0.1$.

7. The ceramic material according to claim 1, wherein one of the components contains, in the A positions, as a doping substance, a metal $M^{III}$ and, in the B positions, a metal $M^{IV}$, wherein $M^{III}$ is bismuth or a metal of the rare earth elements, and $M^{IV}$ is indium, scandium or gallium, and wherein the components have a composition $(Ag_{1-y}M^{III}_y)(Nb_{1-x}Ta_x)_{1-y}M^{IV}_y)O_3$, with $0 < y \leq 0.10$ and $0.35 \leq x \leq 0.5$.

8. The ceramic material according to claim 1, wherein one of the components contains, in the A positions, a metal MIII and, in the B positions, a metal $M^{IV}$, wherein $M^{III}$ is barium, calcium, lead or strontium, and MIV is tin or zirconium, and wherein the components have a composition $(Ag_{1-y}M^{III}_y)(Nb_{1-x}Ta_x)O_3$, with $0 < y \leq 0.10$ and $0.35 \leq x \leq 0.5$.

9. The ceramic material according to claim 1, wherein the first component has a composition $Ag(Nb_{1-x}Ta_x)O_3$ and the second component has a composition $(Ag_{1-x}Sm_y)(Nb_{1-x}Ta_x)_{1-y}Ga_y)O_3$, with $0.38 \leq x \leq 0.42$ and $0.04 \leq y \leq 0.06$, and wherein a volume-specific mixing ratio of first/second components is between 45/55 and 40/60.

10. The ceramic material according to claim 1, wherein the first and second components have a composition $Ag(Nb_{1-x}Ta_x)O_3$, wherein for the first component $0.50 < 1-x 0.70$, and wherein for the second component $0.30 \leq 1-x \leq 0.50$.

11. The ceramic material according to claim 10, wherein the first and second components have a composition $Ag(Nb_{1-x}Ta_x)O_3$, wherein for the first component $0.64 \leq 1-x \leq 0.66$ and for the second component $0.34 \leq 1-x \leq 0.36$, and wherein a volume-specific mixing ratio of first/second components is between 40/60 and 50/50.

12. The ceramic material according to claim 1, wherein the first and second components comprise particles with dimensions between 5 and 500 µm, the particles of the first component being mixed with the particles of the second component.

13. The ceramic material according to claim 12, which is produced by sintering a mixture of particles of the first component with particles of the second component.

14. The ceramic material according to claim 13, which contains $H_3Bo_3$ or $V_2O_5$ as a sintering process material.

* * * * *